US011721680B2

(12) United States Patent
Jung et al.

(10) Patent No.: US 11,721,680 B2
(45) Date of Patent: Aug. 8, 2023

(54) SEMICONDUCTOR PACKAGE HAVING A THREE-DIMENSIONAL STACK STRUCTURE

(71) Applicant: SK hynix Inc., Icheon-si (KR)

(72) Inventors: Yeon Seung Jung, Icheon-si (KR); Jong Hoon Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 31 days.

(21) Appl. No.: 17/363,999

(22) Filed: Jun. 30, 2021

(65) Prior Publication Data

US 2022/0262780 A1 Aug. 18, 2022

(30) Foreign Application Priority Data

Feb. 18, 2021 (KR) ........................ 10-2021-0021571

(51) Int. Cl.
| | |
|---|---|
| *H01L 25/16* | (2023.01) |
| *H01L 23/48* | (2006.01) |
| *H01L 23/31* | (2006.01) |
| *H01L 23/538* | (2006.01) |
| *H01L 23/367* | (2006.01) |
| *H01L 23/498* | (2006.01) |

(52) U.S. Cl.
CPC ........ *H01L 25/165* (2013.01); *H01L 23/3128* (2013.01); *H01L 23/367* (2013.01); *H01L 23/481* (2013.01); *H01L 23/49811* (2013.01); *H01L 23/5384* (2013.01); *H01L 23/5385* (2013.01); *H01L 23/5389* (2013.01)

(58) Field of Classification Search
CPC . H01L 25/165; H01L 23/3128; H01L 23/367; H01L 23/481; H01L 23/49811; H01L 23/5384; H01L 23/5385; H01L 23/5389
See application file for complete search history.

(56) References Cited

U.S. PATENT DOCUMENTS

| | | | |
|---|---|---|---|
| 9,397,078 B1* | 7/2016 | Chandolu | ............... H01L 25/18 |
| 2017/0117205 A1* | 4/2017 | Groothuis | ............. H01L 23/481 |
| 2020/0118902 A1 | 4/2020 | Neal et al. | |
| 2021/0028145 A1* | 1/2021 | Yu | ........................ H01L 21/4853 |
| 2022/0093564 A1* | 3/2022 | Chen | ...................... H01L 24/80 |

FOREIGN PATENT DOCUMENTS

KR 102076948 B1 2/2020

* cited by examiner

*Primary Examiner* — Fernando L Toledo
*Assistant Examiner* — Neil R Prasad
(74) *Attorney, Agent, or Firm* — William Park & Associates Ltd.

(57) ABSTRACT

A semiconductor package includes a package substrate, a plurality of memory stacks, at least one processor chip and one or more heat dissipation structures. The memory stacks are disposed on the package substrate. The memory stacks are spaced apart from each other by a predetermined distance. The processor chip is disposed on the memory stacks to be partially overlapped with each of the memory stacks. The heat dissipation structure is disposed on the upper surfaces of the memory stacks.

21 Claims, 18 Drawing Sheets

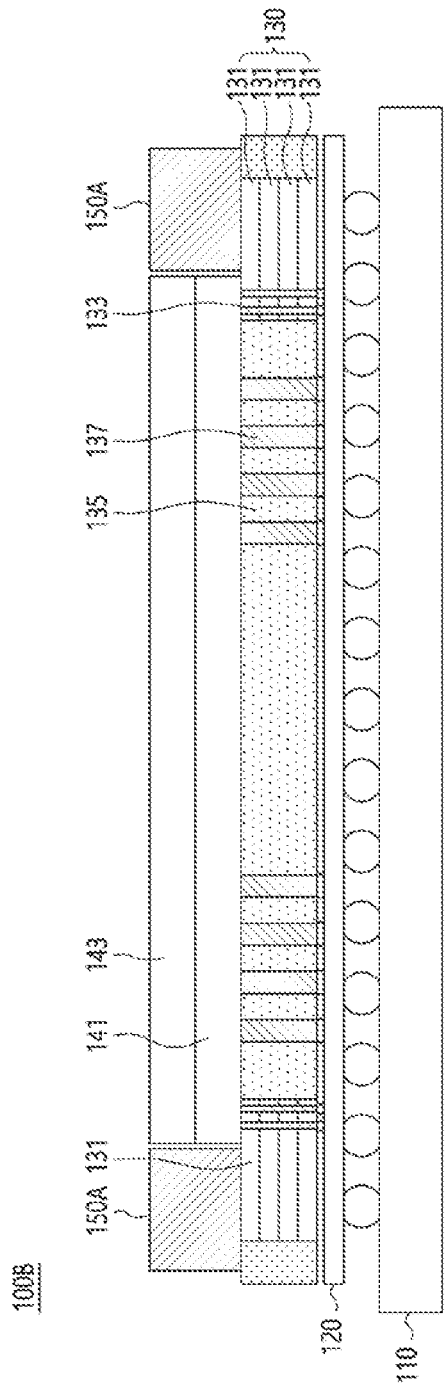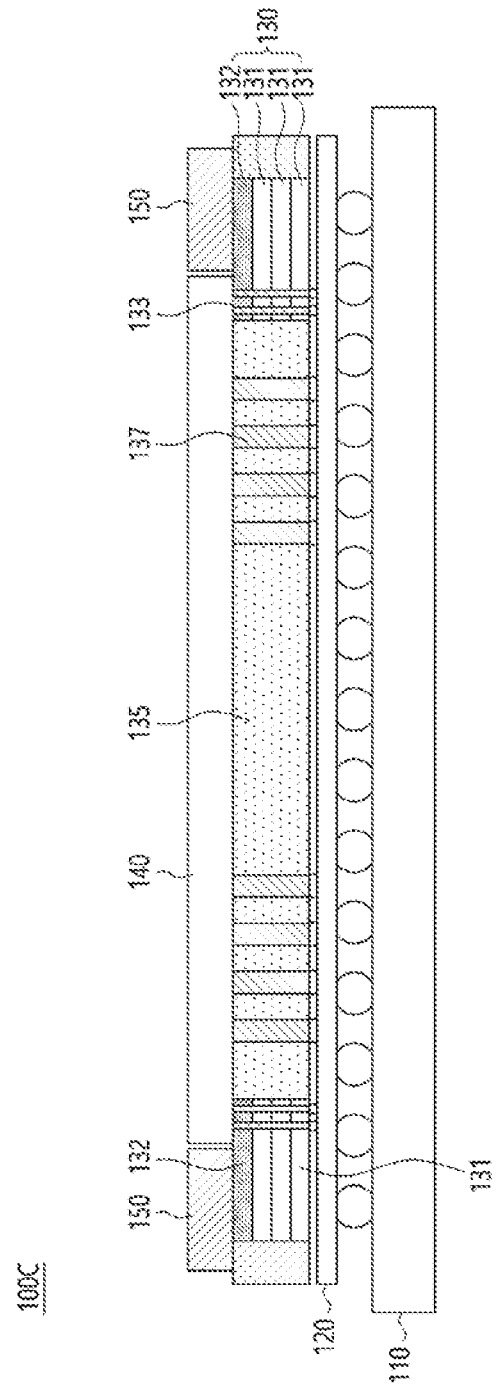

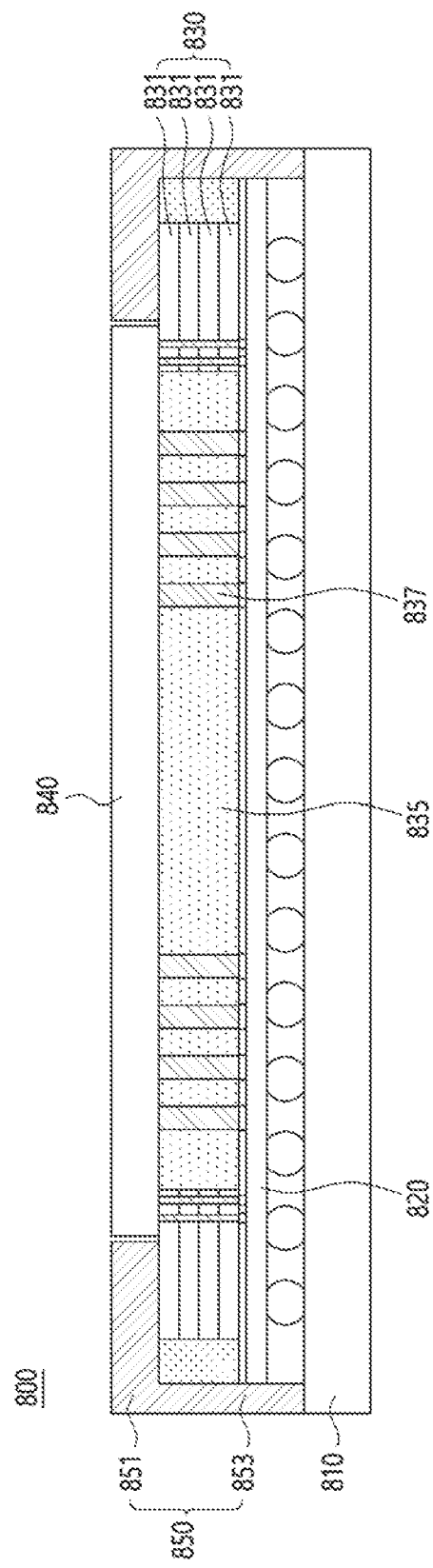

SEMICONDUCTOR PACKAGE HAVING A THREE-DIMENSIONAL STACK STRUCTURE

CROSS-REFERENCES TO RELATED APPLICATION

The present application claims priority under 35 U.S.C. § 119(a) to Korean application number 10-2021-0021571, filed on Feb. 18, 2021, in the Korean Intellectual Property Office, which is incorporated herein by reference in its entirety.

BACKGROUND

1. Technical Field

Various embodiments may generally relate to a semiconductor package, more particularly to a semiconductor package having a three-dimensional stack structure.

2. Related Art

As a volume of an electronic device may have been decreased, it may be required to provide the electronic device with high capacity of data processing. Thus, a semiconductor device used in the electronic device may have been highly integrated.

However, a desired capacity might not be satisfied using a single semiconductor chip due to a limit of a semiconductor integration technology. Therefore, a semiconductor package including a plurality of semiconductor chips may be widely manufactured.

Although the semiconductor package may include the plurality of the semiconductor chips, needs such as operational accuracy, a rapid speed, a small size, a simple process, a low cost, etc., may be satisfied.

SUMMARY

In some embodiments of the present disclosure, a semiconductor package may include a package substrate, a plurality of memory stacks, at least one processor chip and one or more heat dissipation structures. The memory stacks may be disposed on the package substrate. The memory stacks may be spaced apart from each other at a predetermined distance. The process chip may be disposed on the memory stacks to be partially overlapped with each of the memory stacks. The heat dissipation structure may be disposed on the upper surfaces of the memory stacks.

In some embodiments of the present disclosure, a semiconductor package may include: a package substrate; a first memory stack spaced apart from a second memory stack by a predetermined distance, the first and second memory stacks disposed a on the package substrate; and at least one processor chip disposed on the first and second memory stacks and partially overlapped with each of the first and second memory stacks to expose upper surfaces of the first and second memory stacks.

BRIEF DESCRIPTION OF THE DRAWINGS

The above and other aspects, features and advantages of the subject matter of the present disclosure will be more dearly understood from the following detailed description taken in conjunction with the accompanying drawings, in which:

FIG. 4 is a cross-sectional view taken along a line I-I' in FIG. 1 in accordance with various embodiments;

FIG. 5 is a cross-sectional view taken along a line I-I' in FIG. 1 in accordance with various embodiments;

FIG. 20 is a cross-sectional view taken along a line VIII-VIII' in FIG. 19 in accordance with various embodiments.

DETAILED DESCRIPTION

Figure 1:
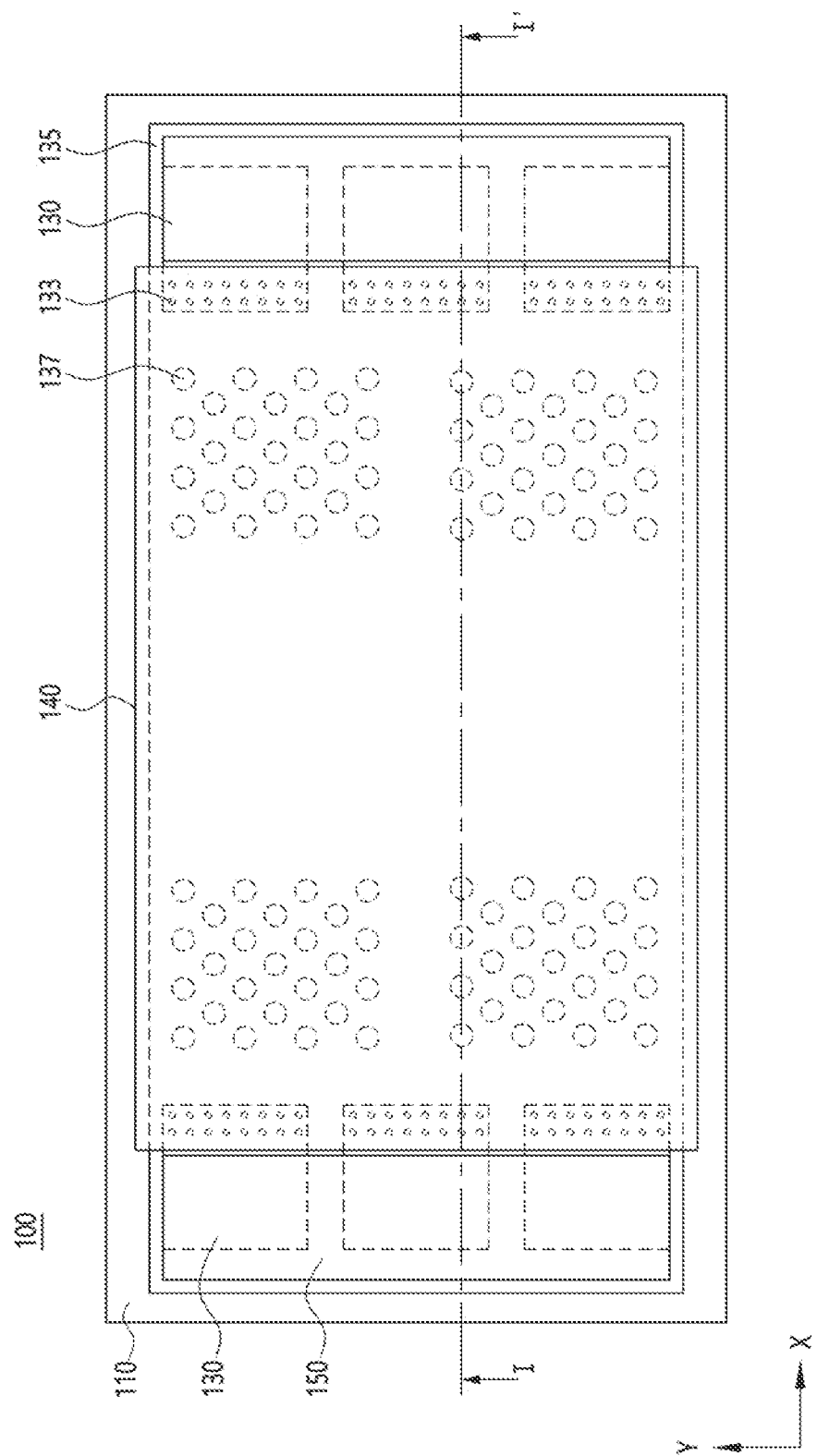
FIG. 1 is a plan view illustrating a semiconductor package in accordance with various embodiments.

Various embodiments of the present disclosure will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the concepts. Although a few embodiments of the present disclosure will be shown and described, it will be appreciated by those of ordinary skill in the art that changes may be made in these embodiments without departing from the principles and spirit of the present disclosure.

Examples of embodiments may provide a semiconductor package having improved performance by decreasing a length of a signal path and increasing the number of input/output lines.

According to some embodiments, the processor chip may be directly connected to the memory stacks to decrease a length of a signal path, thereby reducing an amount of power consumed to transmit a signal. Further, it might not be required to provide the semiconductor package with an additional electrical connection such as a silicon interposer.

Further, the number of input/output lines between the processor chip and an external device may be increased by a through molding via (TMV) formed through a molding layer configured to surround the memory stacks. Thus, the semiconductor package may stably receive a power from the external device. Further, a bandwidth may be extended, thereby improving a performance of the semiconductor package.

Furthermore, the heat dissipation structure may be disposed on the upper surface of the memory stacks to rapidly dissipate a heat generated from the memory stacks.

In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
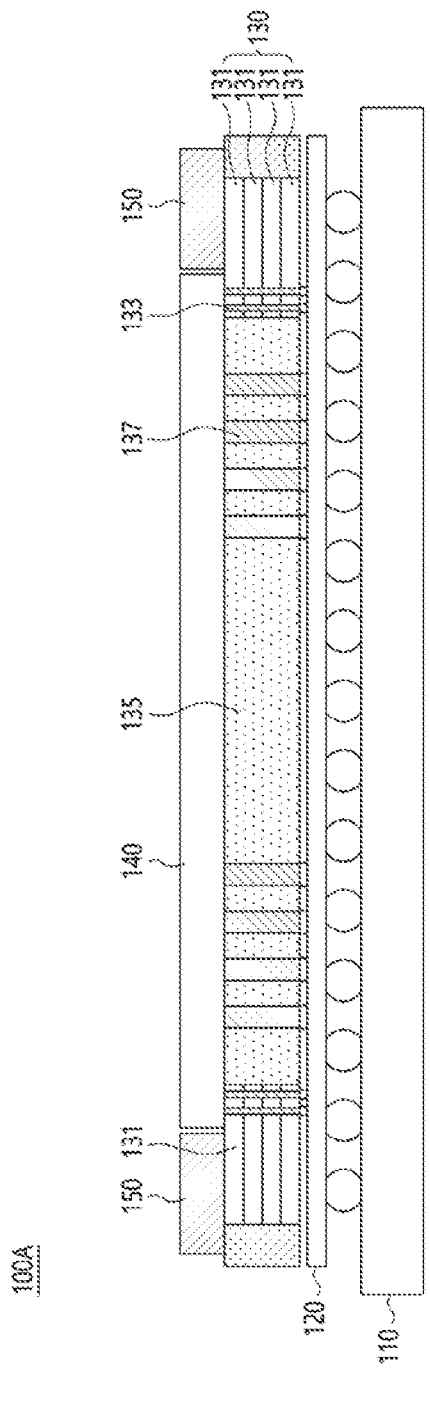
FIG. 2 is a cross-sectional view taken along a line I-I' in FIG. 1 in accordance with various embodiments.

FIG. 1 is a plan view illustrating a semiconductor package in accordance with various embodiments, and FIG. 2 is a cross-sectional view taken along a line I-I' in FIG. 1 in accordance with various embodiments.

Referring to FIGS. 1 and 2, semiconductor packages 100 and 100A of various embodiments may include a package substrate 110, a redistribution layer (RDL) 120, one or more memory stacks 130, a molding layer 135, a processor chip 140 and one or more heat dissipation structures 150.

The package substrate 110 may include a substrate for a semiconductor package such as a printed circuit board (PCB) having a circuit structure and/or a wiring structure configured to transmit electrical signals. The package substrate 110 may have an upper surface and a lower surface opposite to the upper surface. For example, various electronic elements such as the memory stacks 130, the processor chip 140, etc., may be disposed on the upper surface of the package substrate 110. Further, elements configured to connect the semiconductor package to an external device such as external terminals may be disposed on the lower surface of the package substrate 110.

As shown in FIG. 2, the RDL 120 may be disposed on the upper surface of the package substrate 110. Although not illustrated in FIG. 2, the RDL 120 may include an insulation layer and a conductive layer formed in the insulation layer. The conductive layer may include redistribution pads (RDPs) formed on an upper surface and a lower surface of the RDL 120. The RDPs may include upper RDPs formed on the upper surface of the RDL 120 and lower RDPs formed on the lower surface of the RDL 120. The conductive a layer of the RDL 120 may include redistribution lines formed in the insulation layer to be electrically connected between the upper RDPs and the lower RDPs. The upper RDPs of the RDL 120 may be connected to the memory stacks 130. The lower RDPs of the RDL 120 may be connected to the package substrate 110.

The memory stacks 130 may be disposed on the RDL 120. Each of the memory stacks 130 may include vertically stacked memory chips 131. Each of the memory chips 131 may include a volatile memory chip such as a dynamic random-access memory (DRAM), not limited thereto. Alternatively, the memory chips 131 may include other volatile memory chips such as a static random-access memory (SRAM) and non-volatile memory chips such as a NAND flash memory chip, a phase-change random access memory (PRAM), a magneto resistive random-access memory (MRAM), etc.

Each of the memory chips 131 included in the respective memory stacks 130 may include through silicon vias (TSVs) 133 formed through a peripheral circuit region. The respective memory stacks 130 may be electrically connected with the package substrate 110 and the processor chip 140 through the TSVs 133.

For example, the respective memory stacks 130 and the package substrate 110 may be electrically connected with each other by bonding the TSVs 133 to the upper RDPs on the RDL 120. Further, the respective memory stacks 130 and the processor chip 140 may be electrically connected with each other by bonding the TSVs 133 to pads of the processor chip 140. The TSVs 133 of the memory stacks 130, the upper RDPs of the RDL 120 and the pads of the processor chip 140 may be connected with each other by a hybrid bonding process, a bump bonding process, etc.

The memory stacks 130 may be spaced apart from each other on the package substrate 110 by a predetermined distance. Particularly, the memory stacks 130 may be disposed on the RDL 120 formed on the upper surface of the package substrate 110. For example, as shown in FIG. 1, the memory stacks 130 may be disposed adjacent to both edge portions along an X-direction on the package substrate 110. In an embodiment, the TSVs 133 may be positioned at an edge portion of each of the memory stacks 130 as illustrated in FIG. 1. Further, the memory stacks 130 may be spaced apart from each other by the predetermined distance along a Y-direction on the package substrate 110. Thus, the memory stacks 130 might not be disposed on a central portion of the package substrate 110. In an embodiment, a first memory stack may be overlapped by a first side of the processor chip 140 and a second memory stack may be overlapped by a second side of the processor chip 140 as shown in FIG. 1. In an embodiment, the second side of the processor chip 140 may be opposite the first side of the processor chip 140 as shown in FIG. 1. The word "predetermined" as used herein with respect to a parameter, such as a predetermined distance, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The molding layer 135 may be formed to surround all of the memory stacks 130. The memory stacks 130 may be grouped into one package, for example, a memory package by the molding layer 135. The molding layer 135 may be formed to expose the upper surface and the lower surface of each of the memory stacks 130. The molding layer 135 may include an insulation material such as an epoxy molding compound (EMC), not limited thereto.

As mentioned above, because the memory stacks 130 might not be positioned on the central portion of the package substrate 110, as shown in FIG. 2, the molding layer 135 may be disposed on the central portion of the package substrate 110. A through molding vias (TMVs) 137 may be formed through the molding layer 135 on the central portion of the package substrate 110. The TMVs 137 may be vertically formed through the molding layer 135. Thus, the RDL 120 and the processor chip 140 may be electrically connected with each other through the TMVs 137.

The processor chip 140 may be disposed on the memory stacks 130. For example, the processor chip 140 may be disposed on the memory stacks 130 to partially overlapped with the respective memory stacks 130. Alternatively, the processor chip 140 may be disposed on the memory stacks 130 to wholly overlap with the respective memory stacks 130. The processor chip 140 may have an exposed upper surface and a lower surface facing the memory stacks 130. For example, a part of the lower surface of the processor chip 140 and a part of the upper surface of each of the memory stacks 130 may face each other.

Although not depicted in FIGS. 1 and 2, the processor chip 140 may include chip pads disposed on the lower surface of the processor chip 140. The chips pads of the processor chip 140 may include first chips pads directly connected to the TSVs 133 of the memory stacks 130. For example, The TSVs 133 of the memory stacks 130 may be formed at partial regions of the memory stacks 130 overlapped with the processor chip 140, for example, edge regions of the memory stacks 130 and may be directly connected to the first chips pads of the processor chip 140. Although not depicted in FIGS. 1 and 2, the memory stacks 130 may further include TSVs configured to electrically connect the package substrate 110 with the memory chips 131.

The chip pads of the processor chip 140 may include second chips pads connected to the TMVs 137 formed through the molding layer 135. The first and second chip pads of the processor chip 140, the TSVs 133 and the TMVs 137 may be connected with each other by a hybrid bonding process, a bump bonding process, etc.

The processor chip 140 may communicate with an external device through the TMVs 137, the RDL 120 and the package substrate 110. Further, the processor chip 140 may receive power from the external device through the TMVs 137, the RDL 120 and the package substrate 110. Furthermore, the processor chip 140 may transmit and receive signals and data to and from the memory chips 131 in the memory stacks 130 through the TSVs 133.

According to various embodiments, as lengths of signal paths are decreased by direct connections between the processor chip 140 and the memory stacks 130, an amount of power consumed for a signal transmission may be reduced. Further, as the number of input/output lines between the processor chip 140 and the external device is increased by the TMVs 137, the processor chip 140 may stably receive the power from the external device. Further, as a bandwidth between the processor chip 140 and the external device is extended by the TMVs 137, a performance of the semiconductor package may be improved.

The heat dissipation structure 150 may be disposed on the memory stacks 130 to cover the memory stacks 130. For example, the upper surface of each of the memory stacks 130 may include a first upper surface overlapped with the processor chip 140 and a second upper surface exposed without overlapping the processor chip 140. The heat dissipation structure 150 may be disposed on the memory stacks 130 to cover the second upper surface of each of the memory stacks 130. Although not depicted in FIGS. 1 and 2, a thermal interface material (TIM) may be interposed between the heat dissipation structure 150 and the second upper surfaces of the memory stacks 130 to increase thermal conductivity. The heat dissipation structure 150 may include a metal such as copper, nickel, etc., not limited thereto. Therefore, as the heat dissipation structure 150 is disposed on the memory stacks 130, the heat generated from the memory stacks 130 may dissipate. In an embodiment, a first heat dissipation structure may be located adjacent a first side of the processor chip 140 and a second heat dissipation structure may be located adjacent a second side of the processor chip 140 as shown in FIG. 1. In an embodiment, the second side of the processor chip 140 may be opposite the first side of the processor chip 140 as shown in FIG. 1.

Further, although not depicted in FIGS. 1 and 2, a heat sink may be disposed on the processor chip 140 and the at least one heat dissipation structure 150. The heat sink may include a metal such as copper, nickel, etc., not limited thereto. The heat sink may make contact with the heat dissipation structure 150 and the processor chip 140 to decrease temperatures of the processor chip 140 and the memory stacks 130.

Figure 3:
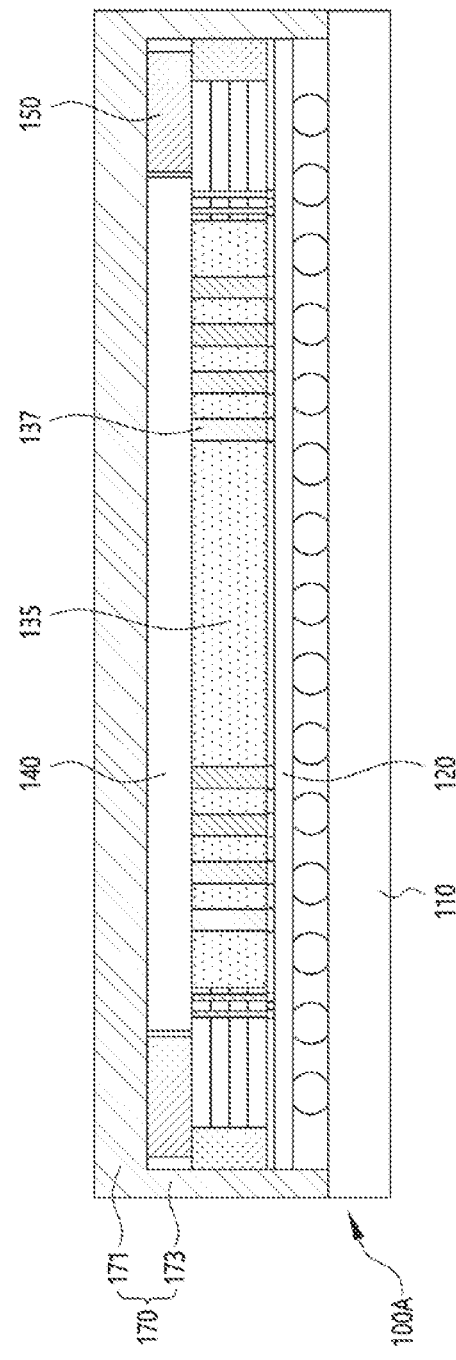
FIG. 3 is a cross-sectional view illustrating a lid added to the semiconductor package in FIG. 2.

FIG. 3 is a cross-sectional view illustrating a lid added to the semiconductor package in FIG. 2.

A semiconductor package of this example of an embodiment may include elements substantially the same as those of the semiconductor package 100A in FIG. 2 except for further including a lid. Thus, the same reference numerals may refer to the same elements and any further illustrations with respect to the same elements may be omitted herein for brevity.

Referring to FIG. 3, the lid 170 may be disposed on the package substrate 110 to cover the RDL 120, the molding layer 135, the processor chip 140 and the heat dissipation structure 150. For example, the lid 170 may include a first lid 171 and a second lid 173. The first lid 171 may be extended in a direction parallel to the upper surface of the package substrate 110. The second lid 173 may be extended toward the upper surface of the package substrate 110 from edges of a lower surface of the first lid 171.

The lower surface of the first lid 171 may contact with the upper surfaces of the processor chip 140 and the heat dissipation structure 150. The second lid 173 may cover the upper surface of the package substrate 110, side surfaces of the RDL 120 and side surfaces of the molding layer 135. The lid 170 may include a metal such as copper, nickel, etc., not limited thereto. Although not depicted in FIG. 3, a heat sink may be disposed on an upper surface of the first lid 171. Further, a TIM may be interposed between the lower surface of the first lid 171 and the upper surface of the processor chip 140.

FIG. 4 is a cross-sectional view taken along a line I-I' in FIG. 1 in accordance with various embodiments.

A semiconductor package 100E of this example of an embodiment may include elements substantially the same as those of the semiconductor package 100A in FIG. 2 except for a processor chip. Thus, the same reference numerals may refer to the same elements and any further illustrations with respect to the same elements may be omitted herein for brevity.

Referring to FIG. 4, the semiconductor package 100B may include the package substrate 110, the RDL 120, the memory stacks 130, the molding layer 135, a first processor chip 141, a second processor chip 143 and a heat dissipation structure 150A.

The first processor chip 141 may be disposed on the memory stacks 130. The first processor chip 141 may partially overlap with the memory stacks 130. The first processor chip 141 may include a lower surface in contact with the memory stacks 130 and an upper surface opposite to the lower surface. For example, the lower surface of the first processor chip 141 may partially overlap with the upper surface of each of the memory stacks 130.

The second processor chip 143 may be disposed on the upper surface of the first processor chip 141. The second processor chip 143 may include a lower surface in contact with the first processor chip 141 and an upper surface exposed to an outside. The upper surface of the first processor chip 141 and the lower surface of the second processor chip 143 may be connected with each other by a hybrid bonding process, a bump bonding process, etc.

Although not depicted in FIG. 4, the first processor chip 141 may include through silicon vias (TSVs). The second processor chip 143 may be electrically connected with the memory stacks 130, the TMVs 137 of the molding layer 135, the RCL 120 and the package substrate 110 through the TSVs of the first processor chip 141. The first processor chip 141 and the second processor chip 143 may have different functions. Further, although not depicted in FIG. 4, a heat sink may be disposed on the second processor chip 143 and the at least one heat dissipation structure 150A. The heat sink may include a metal such as copper, nickel, etc., not limited thereto. The heat sink may make contact with the heat dissipation structure 150A and the second processor chip 143 to decrease temperatures of the first and second processor chips 141 and 143 as well as the memory stacks 130.

FIG. 5 is a cross-sectional view taken along a line I-I' in FIG. 1 in accordance with various embodiments.

A semiconductor package 1000 of this example of an embodiment may include elements substantially the same as those of the semiconductor package 100A in FIG. 2. Thus, the same reference numerals may refer to the same elements and any further illustrations with respect to the same elements may be omitted herein for brevity.

Referring to FIG. 5, the semiconductor package 100C may include the package substrate 110, the RDL 120, the memory stacks 130, the molding layer 135, the processor chip 140 and the heat dissipation structure 150.

The memory stacks 130 may be disposed on the RDL 120. Each of the memory stacks 130 may include the vertically stacked memory chips 131 and a controller chip 132 disposed on an uppermost memory chip 131. The controller chip 132 may include logic circuits configured to control operations of the memory chips 131 in accordance with signals received from the processor chip 140. The memory chips 131 and the controller chip 132 in each of the memory stack 130 may include through silicon vias (TSVs) 133. Each of the memory stacks 130 may be electrically connected with the package substrate 110 and the processor chip 140 through the TSVs 133.

Figure 6:
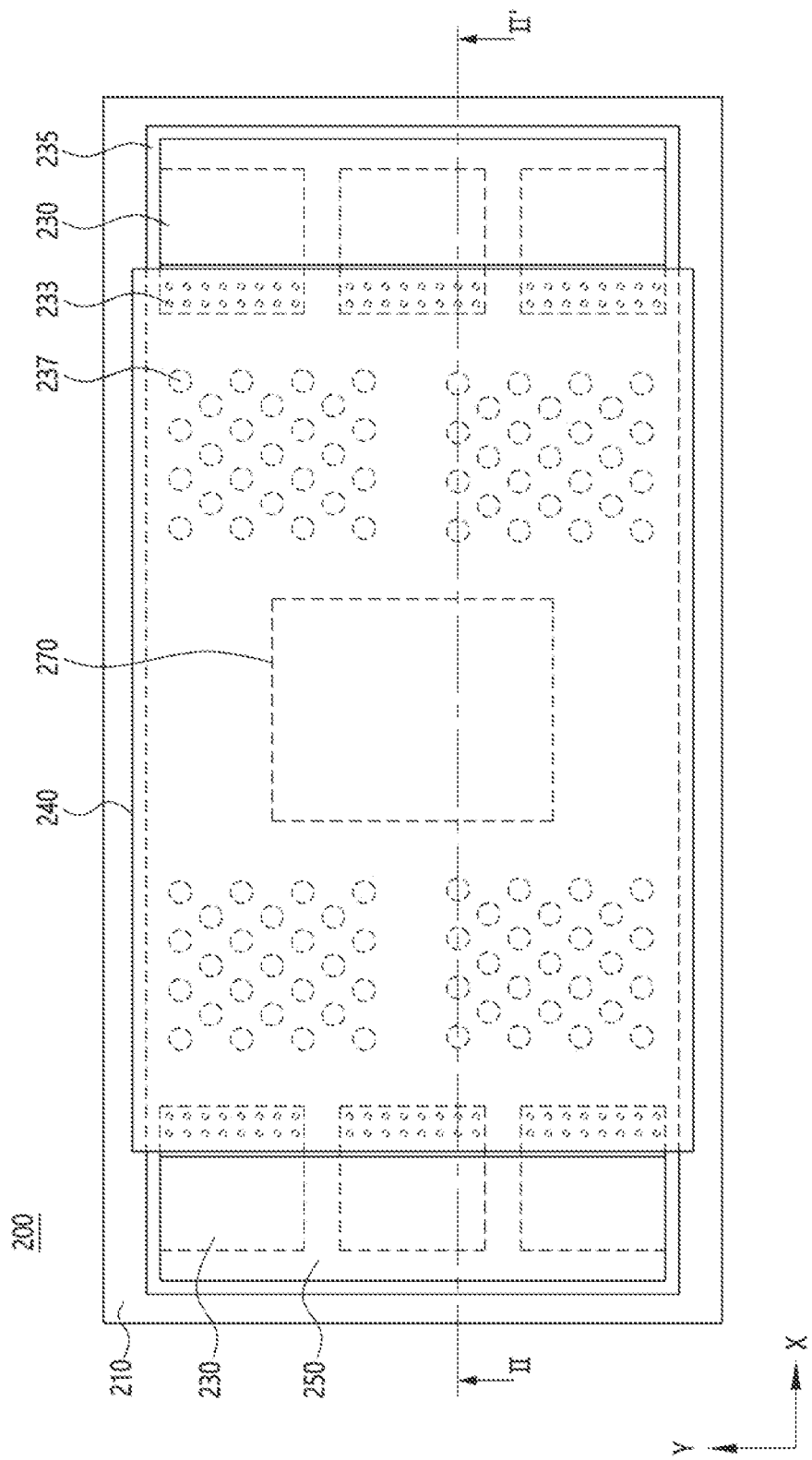
FIG. 6 is a plan view illustrating a semiconductor package in accordance with various embodiments.
Figure 7:
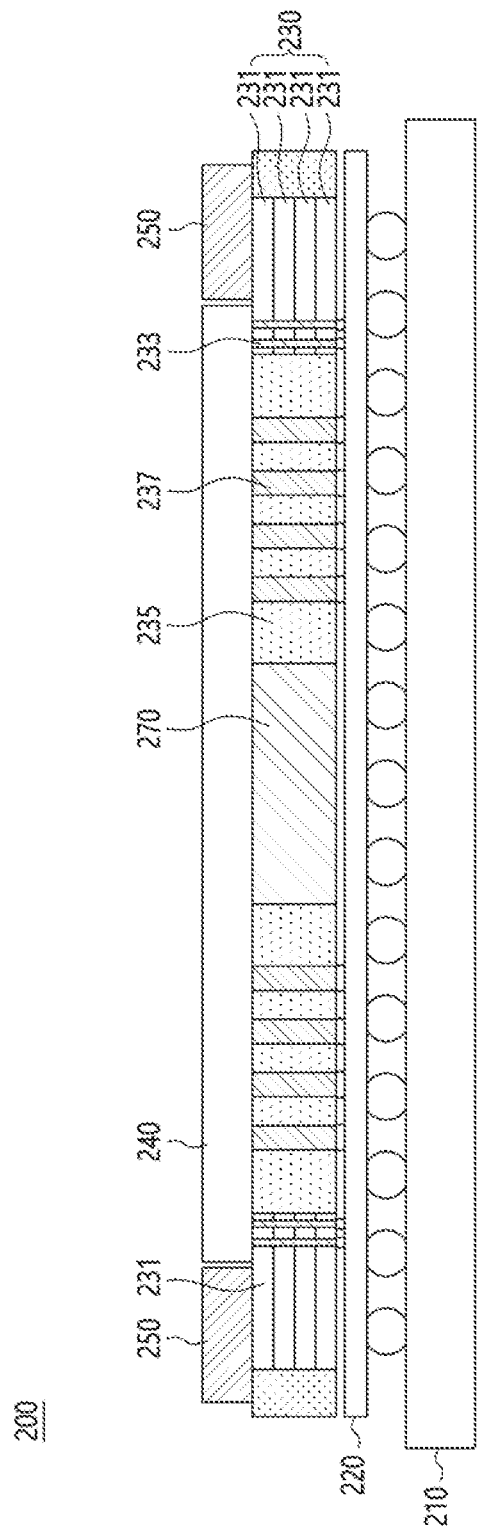
FIG. 7 is a cross-sectional view taken along a line II-II' in FIG. 6 in accordance with various embodiments.

FIG. 6 is a plan view illustrating a semiconductor package in accordance with various embodiments, and FIG. 7 is a cross-sectional view taken along a line II-II' in FIG. 6 in accordance with various embodiments.

A semiconductor package 200 of this example of an embodiment may include elements substantially the same as those of the semiconductor package 100A in FIG. 2. Thus, any further illustrations with respect to the same elements may be omitted herein for brevity.

Referring to FIGS. 6 and 7, the semiconductor package 200 may include a package substrate 210, a redistribution layer (RDL) 220, a plurality of memory stacks 230, a molding layer 235, a processor chip 240, a heat dissipation structure 250 and a semiconductor chip 270.

Each of the memory stacks 230 may include vertically stacked memory chips 231. Each of the memory stacks 230 may include through silicon vias (TSVs) 233 configured to electrically connect the memory chips 231 with each other, and to electrically connect the processor chip 240, the memory stack 230 and the RDL 220 with each other.

The molding layer 235 may be formed to surround the memory stacks 230. The molding layer 235 may include through molding vias (TMVs) 237 configured to electrically connect the processor chip 240 with the RDL 220.

The semiconductor chip 270 may be connected to a lower surface of the processor chip 240. Side surfaces of the semiconductor chip 270 may be covered by the molding layer 235. The semiconductor chip 270 may operate in accordance with signals received from the processor chip 240. The semiconductor chip 270 may include a different type of memory chip from the memory chips 231 in the memory stacks 230. Further, the semiconductor chip 270 may include a logic chip having a function different from that of the processor chip 240. The semiconductor chip 270 and the processor chip 240 may be connected with each other by a hybrid bonding process, a bump bonding process, etc.

Figure 8:
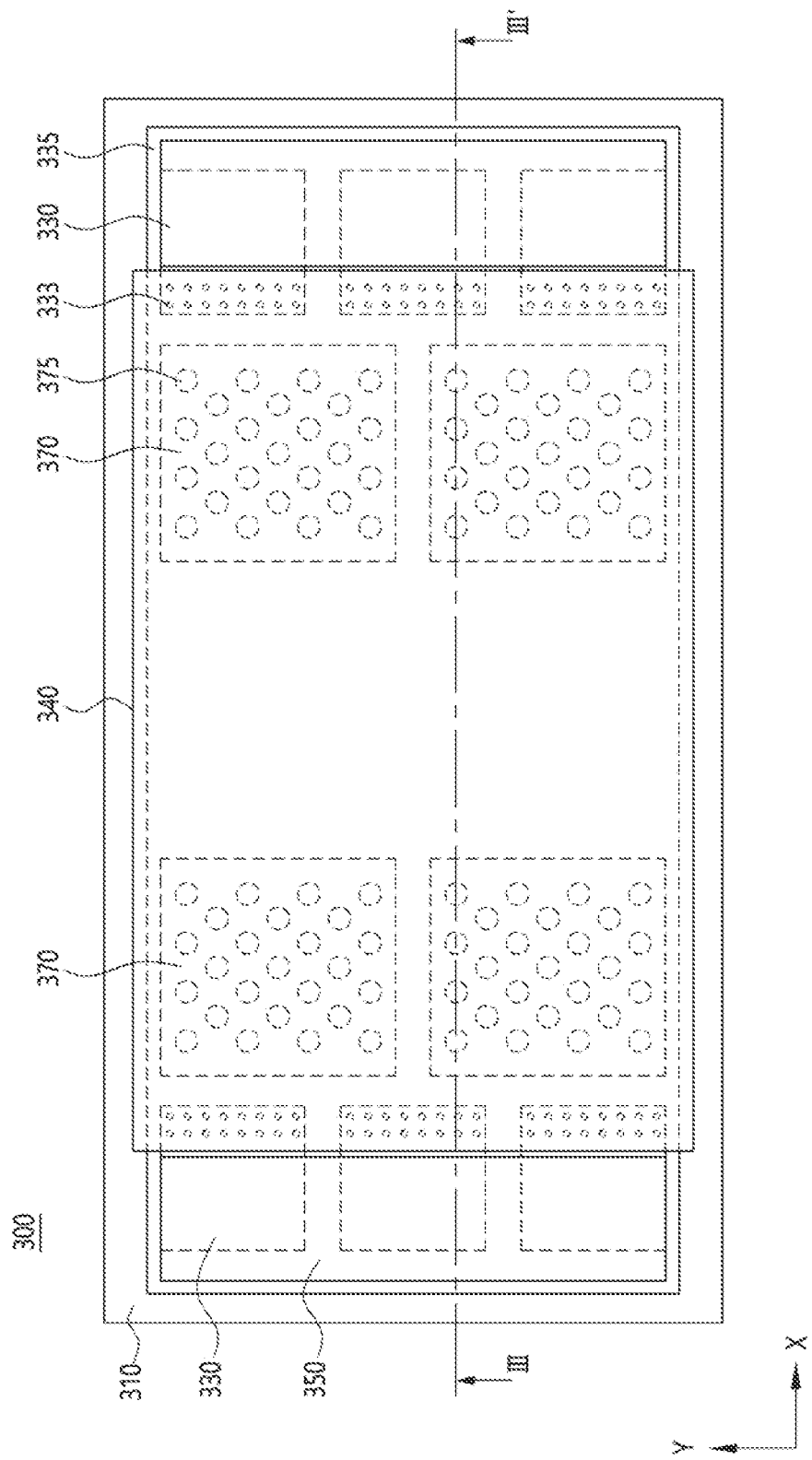
FIG. 8 is a plan view illustrating a semiconductor package in accordance with various embodiments.
Figure 9:
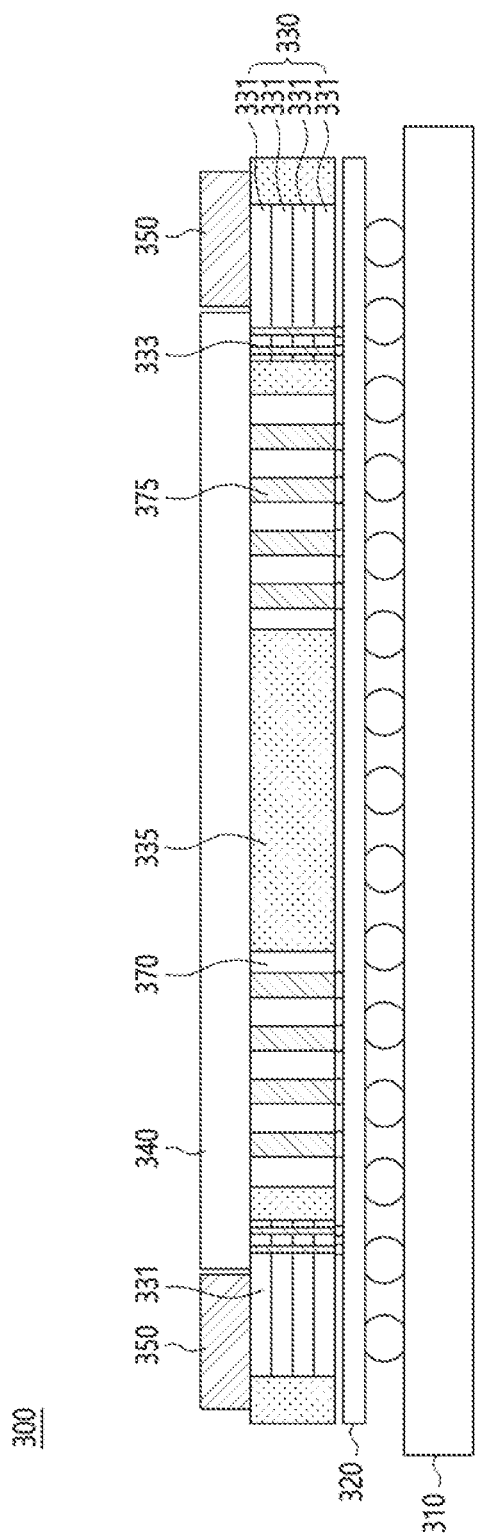
FIG. 9 is a cross-sectional view taken along a line III-III' in FIG. 8 in accordance with various embodiments.

FIG. 8 is a plan view illustrating a semiconductor package in accordance with various embodiments, and FIG. 9 is a cross-sectional view taken along a line III-III' in FIG. 8 in accordance with various embodiments.

A semiconductor package 300 of this example of an embodiment may include elements substantially the same as those of the semiconductor package 100A in FIG. 2. Thus, any further illustrations with respect to the same elements may be omitted herein for brevity.

Referring to FIGS. 8 and 9, the semiconductor package 300 may include a package substrate 310, a redistribution layer (RDL) 320, a plurality of memory stacks 330, a molding layer 335, a processor chip 340, a heat dissipation structure 350 and bridge dies 370.

Each of the memory stacks 330 may include vertically stacked memory chips 331. Each of the memory stacks 330 may include through silicon vias (TSVs) 333 formed to electrically connect the memory chips 331 with each other, and to electrically connect the processor chip 340, the memory stack 330 and the RDL 320 with each other.

The bridge dies 370 may be disposed on the RDL 320. In an embodiment, the bridge dies 370 may be disposed on the package substrate 310 adjacent the memory stacks 330. For example, the bridge dies 370 may be positioned between the processor chip 340 and the RDL 320. Each of the bridge dies 370 may be positioned adjacent to each of the memory stacks 330. As shown in FIG. 8, the bridge dies 370 may be spaced apart from each other in the X-direction and the Y-direction by a predetermined distance. Side surfaces of each of the bridge dies 370 may be covered by the molding layer 335.

In FIGS. 8 and 9, a plurality of single bridge dies 370 may be disposed spaced apart from each other between the RDL 320 and the processor chip 340. Alternatively, based on stacked numbers of the memory chips 331 of the memory stack 330, a plurality of bridge die stacks including stacked bridge dies 370 may be disposed spaced apart from each other between the RDL 320 and the processor chip 340. Thus, the bridge dies 370 may have a height corresponding to a height of the memory stack 330. Each of the bridge dies 370 may include through silicon vias (TSVs) 375 configured to electrically connect the processor chip 340 with the RDL 320. In an embodiment, each of the bridge dies 370 may include through silicon vias (TSVs) 375 configured to electrically connect the processor chip 340 with the package substrate 310.

Figure 10:
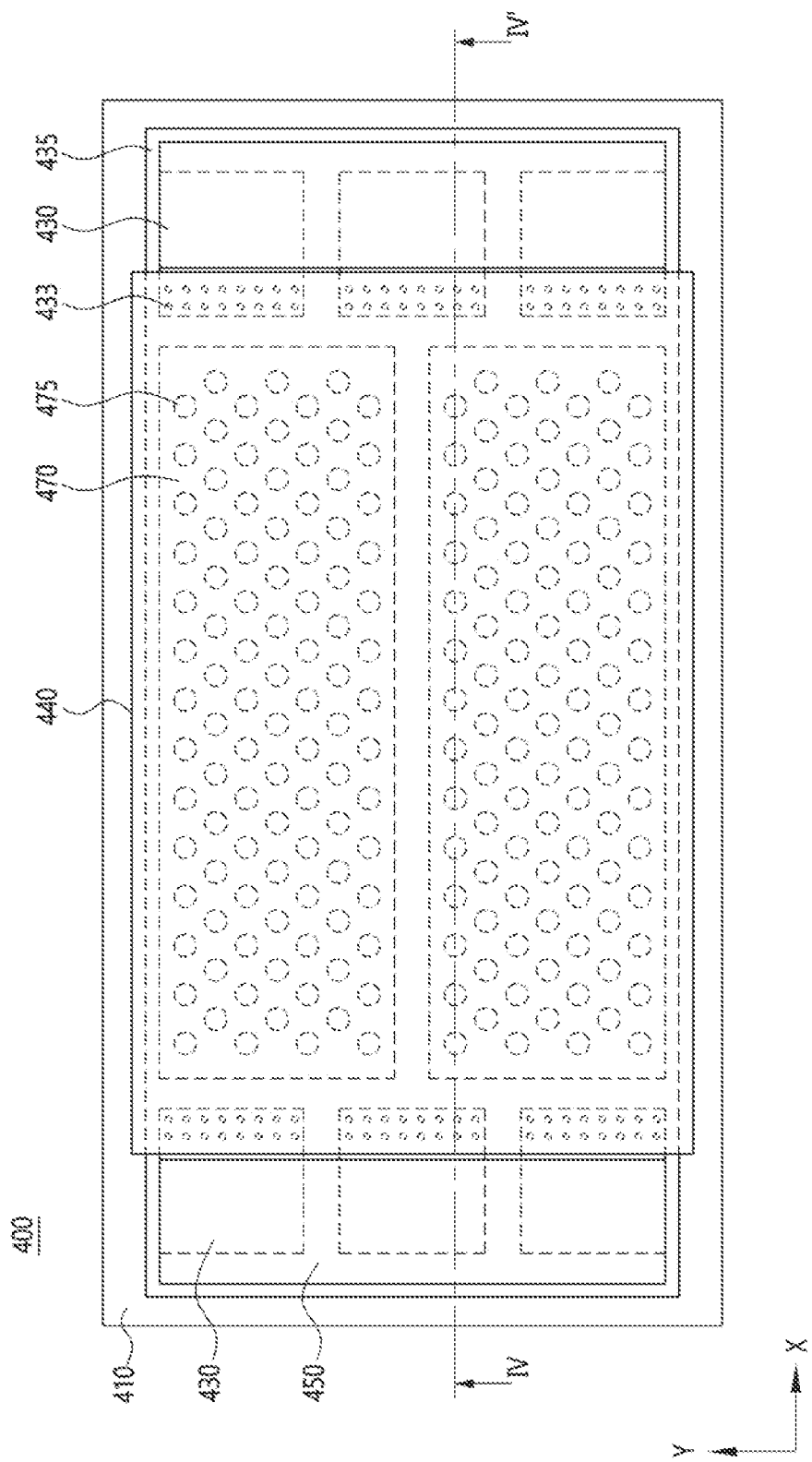
FIG. 10 is a plan view illustrating a semiconductor package in accordance with various embodiments.

FIG. 10 is a plan view illustrating a semiconductor package in accordance with various embodiments, and FIG.

11 is a cross-sectional view taken along a line IV-IV' in FIG. 10 in accordance with various embodiments.

A semiconductor package 400 of this example of an embodiment may include elements substantially the same as those of the semiconductor package 100A in FIG. 2. Thus, any further illustrations with respect to the same elements may be omitted herein for brevity.

Figure 11:
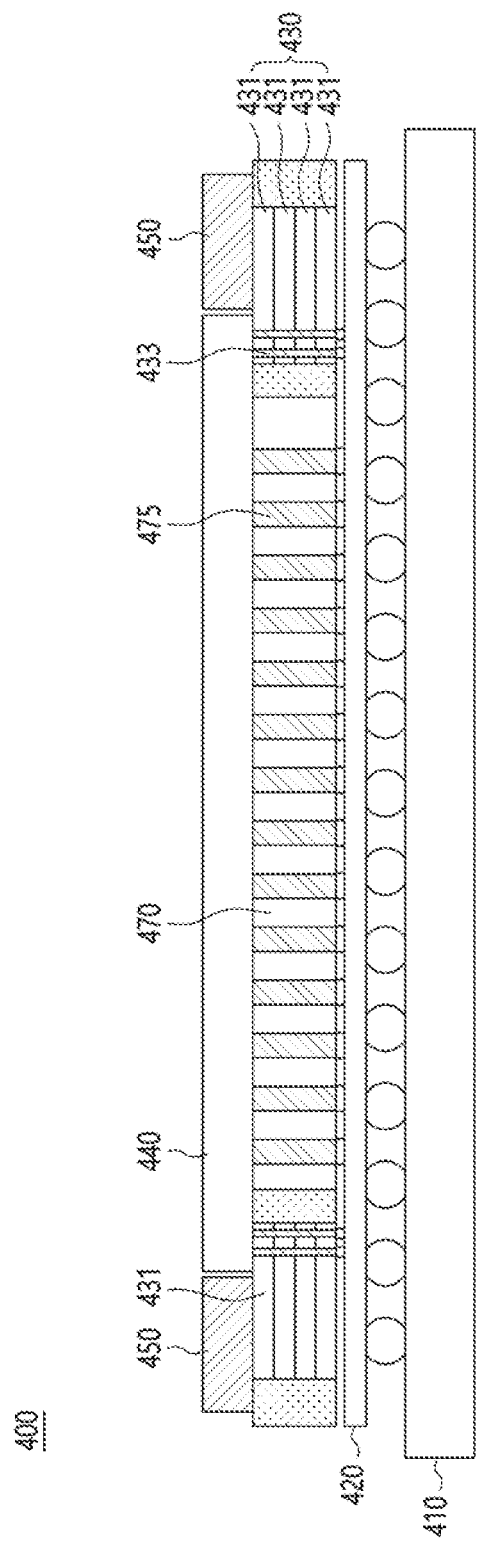
FIG. 11 is a cross-sectional view taken along a line IV-IV' in FIG. 10 in accordance with various embodiments.

Referring to FIGS. 10 and 11, the semiconductor package 400 may include a package substrate 410, a redistribution layer (RDL) 420, a plurality of memory stacks 430, a molding layer 435, a processor chip 440, a heat dissipation structure 450 and bridge dies 470.

Each of the memory stacks 430 may include vertically stacked memory chips 431. Each of the memory stacks 430 may include through silicon vias (TSVs) 433 configured to electrically connect the memory chips 431 with each other, and to electrically connect the processor chip 440, the memory stack 430 and the RDL 420 with each other.

The bridge dies 470 may be disposed on the RDL 420. For example, the bridge dies 470 may be positioned between the processor chip 440 and the RDL 420. As shown in FIG. 10, the bridge dies 470 may be spaced apart from each other in the Y-direction by a predetermined distance on a plane. Side surfaces of each of the bridge dies 470 may be covered by the molding layer 435.

In FIG. 11, a plurality of single bridge dies 470 may be disposed spaced apart from each other between the RDL 420 and the processor chip 440. Alternatively, based on stacked numbers of the memory chips 431 of the memory stack 430, a plurality of bridge die stacks including stacked bridge dies 470 may be disposed spaced apart from each other between the RDL 420 and the processor chip 440. Each of the bridge dies 470 may include through silicon vias (TSVs) 475 configured to electrically connect the processor chip 440 with the RDL 420.

Figure 12:
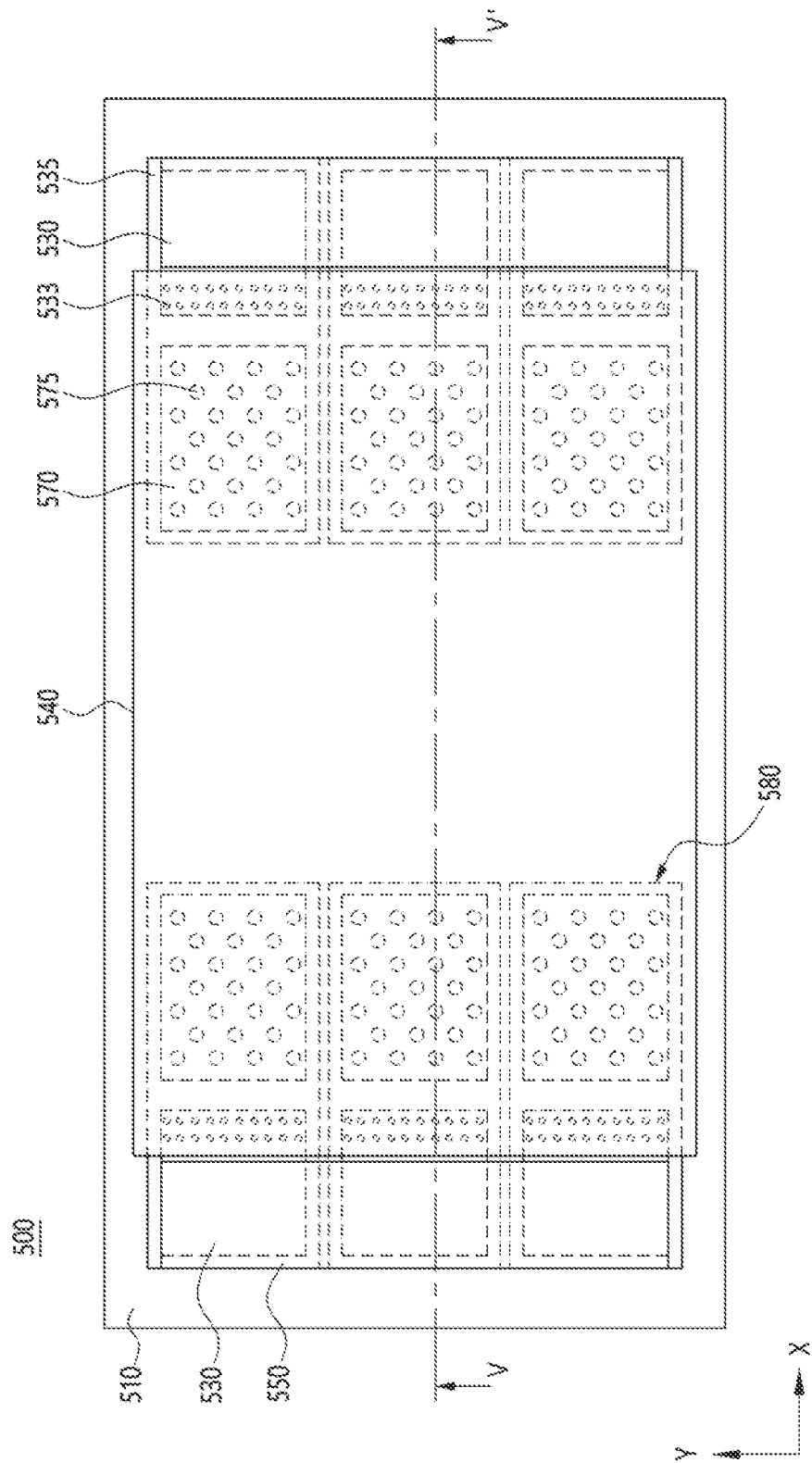
FIG. 12 is a plan view illustrating a semiconductor package in accordance with various embodiments.
Figure 13:
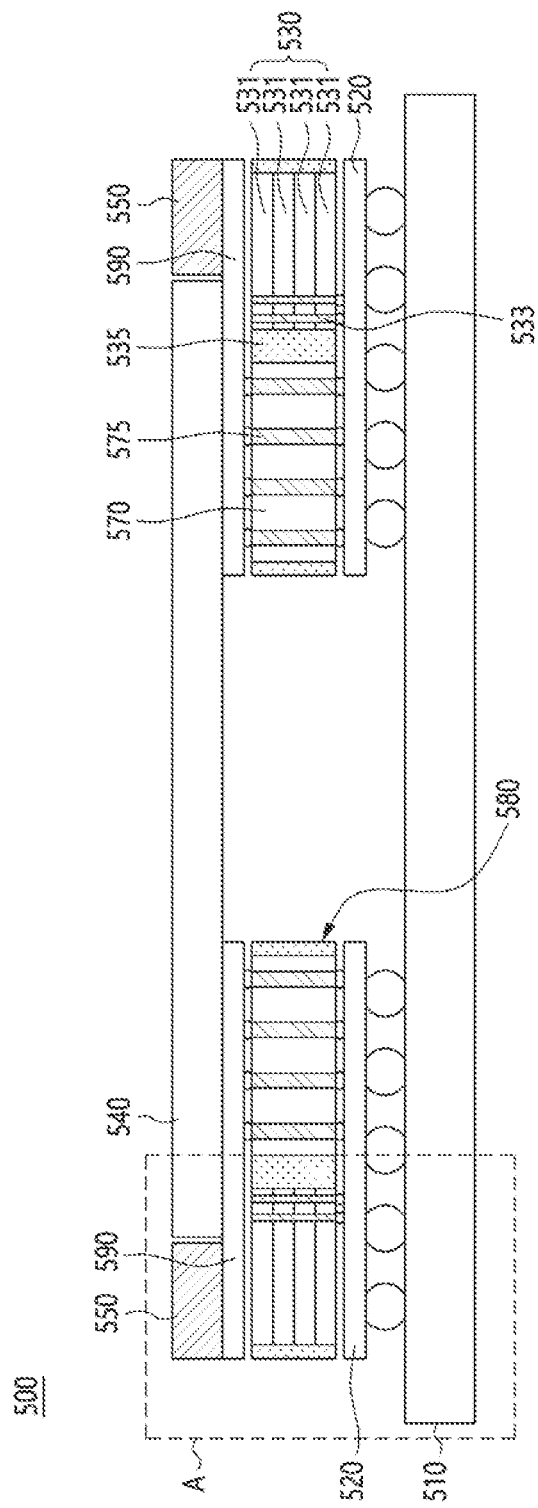
FIG. 13 is a cross-sectional view taken along a line V-V' in FIG. 12 in accordance with various embodiments.
Figure 14:
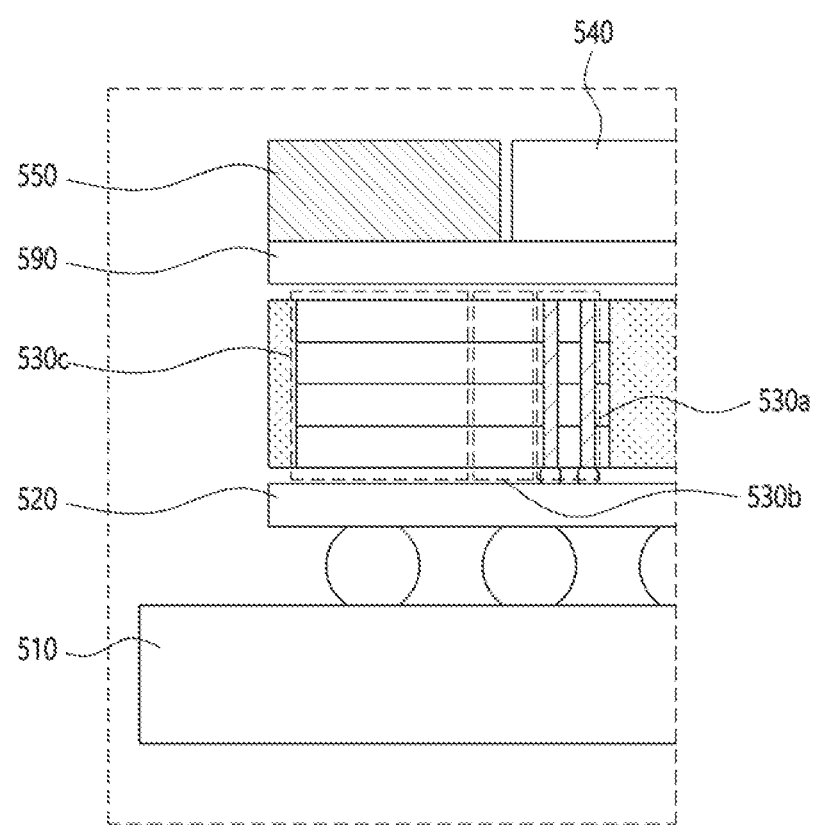
FIG. 14 is an enlarged cross-sectional view of a portion "A" in FIG. 13.

FIG. 12 is a plan view illustrating a semiconductor package in accordance with various embodiments, FIG. 13 is a cross-sectional view taken along a line V-V' in FIG. 12 in accordance with various embodiments, and FIG. 14 is an enlarged cross-sectional view of a portion "A" in FIG. 13.

A semiconductor package 500 of this example of an embodiment may include elements substantially the same as those of the semiconductor package 100A in FIG. 2. Thus, any further illustrations with respect to the same elements may be omitted herein for brevity.

Referring to FIGS. 12 and 13, the semiconductor package 500 may include a package substrate 510, a lower redistribution layer (RDL) 520, a plurality of memory stack units 580, a processor chip 540, a heat dissipation structure 550 and an upper RDL 590. Each of the memory stack units 580 may include a memory stack 530, bridge dies 570 and a molding layer 535.

Referring to FIG. 14, the memory stack 530 may include a first region 530a, a second region 530b and a third region 530c. The first region 530a of the memory stack 530 may be overlapped with the processor chip 540. Through silicon vias (TSVs) 533 may be formed in the first region 530a of the memory stack 530. In an embodiment, first region 530a may be overlapped with the processor chip 540 in a vertical direction as shown in FIG. 14. The second region 530b of the memory stack 530 may be partially overlapped with the processor chip 540 and the heat dissipation structure 550. In an embodiment, the second region 530b may be overlapped with a part of the processor chip 540 and a part of the heat dissipation structure 550 in the vertical direction as shown in FIG. 14. The third region 530c of the memory stack 530 may be overlapped with the heat dissipation structure 550. In an embodiment, the third region 530c may be overlapped with the heat dissipation structure 550 in the vertical direction as shown in FIG. 14. For example, the first region 530a of the memory stack 530 may correspond to a peripheral circuit region. Further, the second region 530b and the third region 530c in the memory stack 530 may correspond to a cell region. Furthermore, the second region 530b of the memory stack 530 may include dummy cells and the third region 530c of the memory stack 530 may include working cells. Thus, cells in the second region 530b of the memory stack 530 partially overlapped with the heat dissipation structure 550 may be designated as the dummy cells to prevent data loss caused by the heat, thereby improving reliability of the semiconductor package.

The bridge dies 570 may be positioned adjacent to the memory stack 530. The bridge dies 570 may include through silicon vias (TSVs) 575 configured to electrically connect the upper RDL 590 with the lower RDL 520.

The molding layer 535 may be formed to surround side surfaces of the memory stacks 530 and the bridge dies 570. Thus, upper and lower surfaces of the memory stacks 530 and upper and lower surfaces of the bridge dies 570 may be exposed without being surrounding with the molding layer 535.

As shown in FIG. 12, the memory stack units 580 may be disposed spaced apart from each other along the X-direction and the Y-direction by a predetermined distance on a plane. Thus, empty spaces without the molding layer 535 may be formed between the memory stack units 580 along the X-direction.

The upper RDL 590 may be disposed on an upper portion of the memory stack 530. The lower RDL 520 may be disposed on a lower portion of the memory stack 530. The processor chip 540 and the heat dissipation structure 550 may be disposed on the upper RDL 590.

Figure 15:
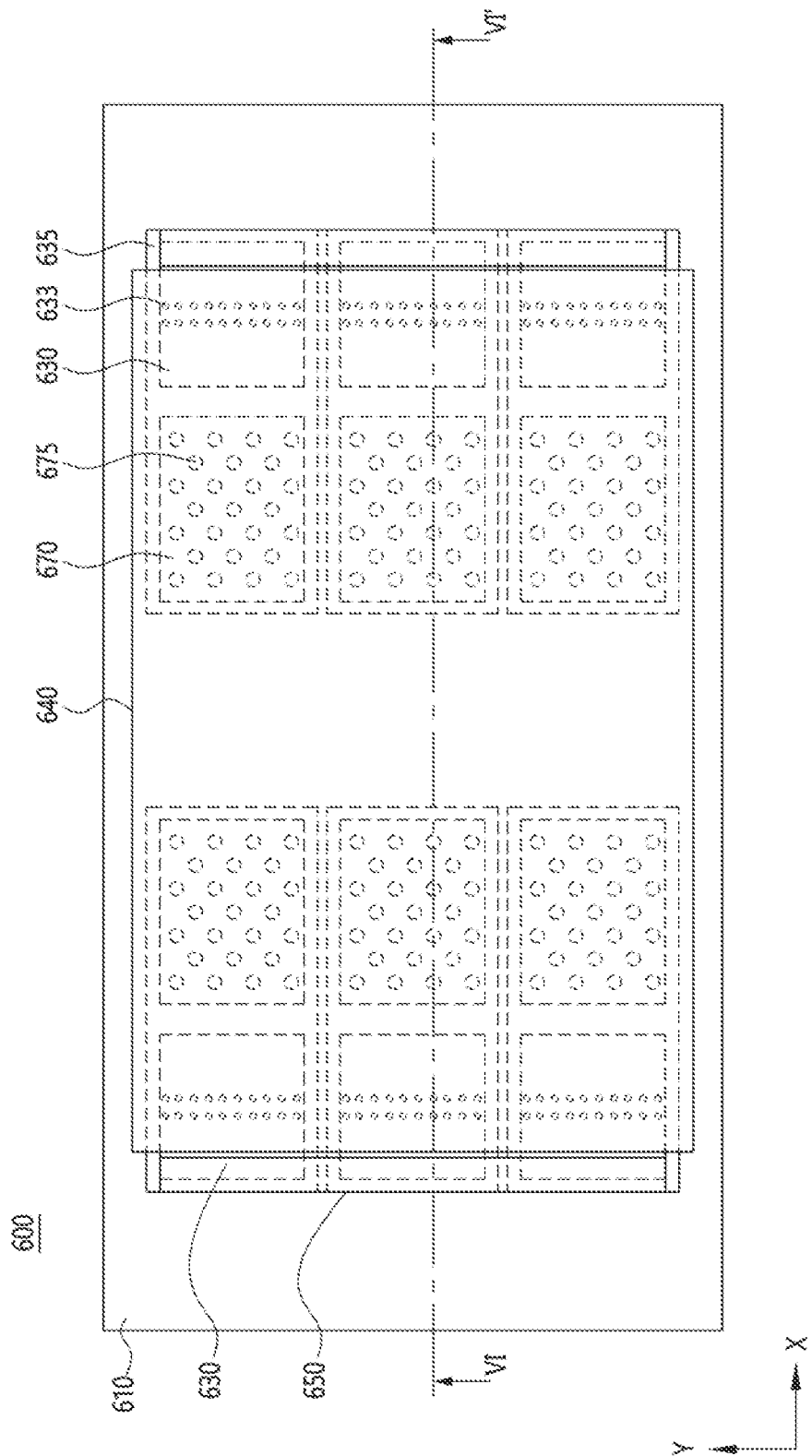
FIG. 15 is a plan view illustrating a semiconductor package in accordance with various embodiments.
Figure 16:
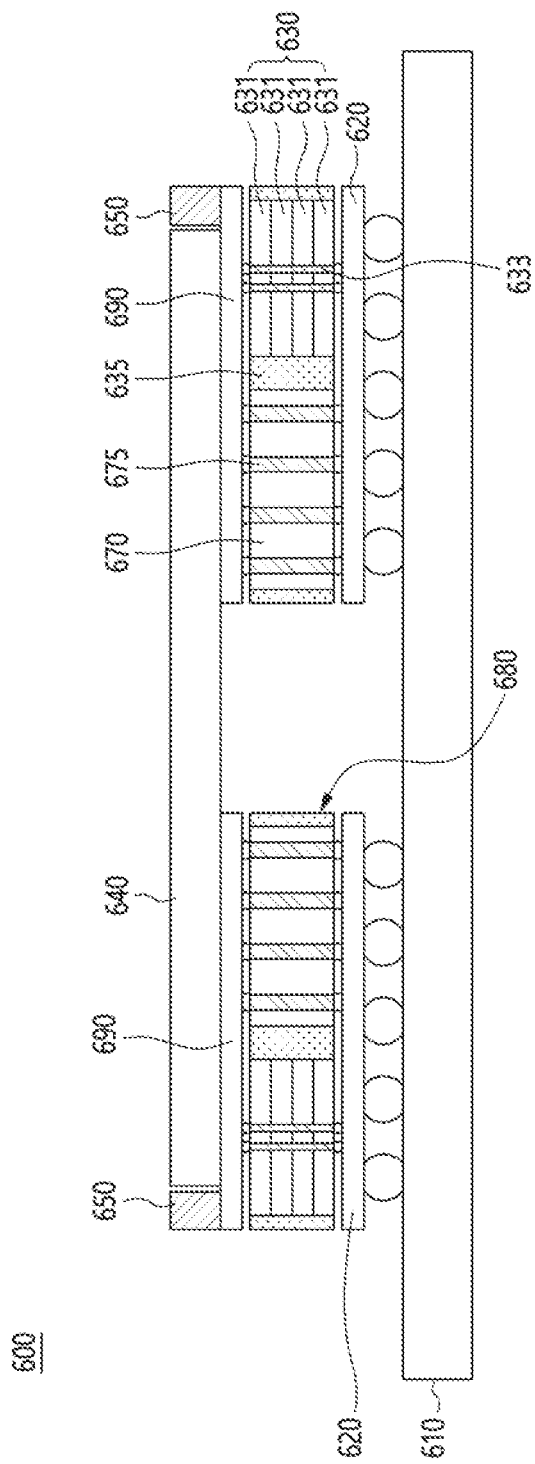
FIG. 16 is a cross-sectional view taken along a line VI-VI' in FIG. 15 in accordance with various embodiments.

FIG. 15 is a plan view illustrating a semiconductor package in accordance with various embodiments, and FIG. 16 is a cross-sectional view taken along a line VI-VI' in FIG. 15 in accordance with various embodiments.

A semiconductor package 600 of this example of an embodiment may include elements substantially the same as those of the semiconductor package 100A in FIG. 2. Thus, any further illustrations with respect to the same elements may be omitted herein for brevity.

Referring to FIGS. 15 and 16, the semiconductor package 600 may include a package substrate 610, a lower redistribution layer (RDL) 620, a plurality of memory stack units 680, a processor chip 640, a heat dissipation structure 650 and an upper RDL 690. Each of the memory stack units 680 may include a memory stack 630, bridge dies 670 and a molding layer 635. The memory stack 630 may include vertically stacked memory chips 631. The memory stack 630 may include through silicon vias (TSVs) 633 configured to electrically connect the memory chips 631 with each other, and to electrically connect the upper RDL 690, the memory stack 630 and the lower RDL 620 with each other.

In various embodiments, the TSVs 633 of the memory stack 630 may be positioned at a central portion of the memory stack 630. Thus, because the TSVs 633 may be located at the central portion of the memory stack 630, a length between the TSVs 633 and a cell region positioned farthest from the TSVs 633, for example, a length of a signal path may be shortened so that a signal may be rapidly transmitted. Further, power consumption for the signal transmission may be decreased due to the short length of the signal path.

Figure 17:
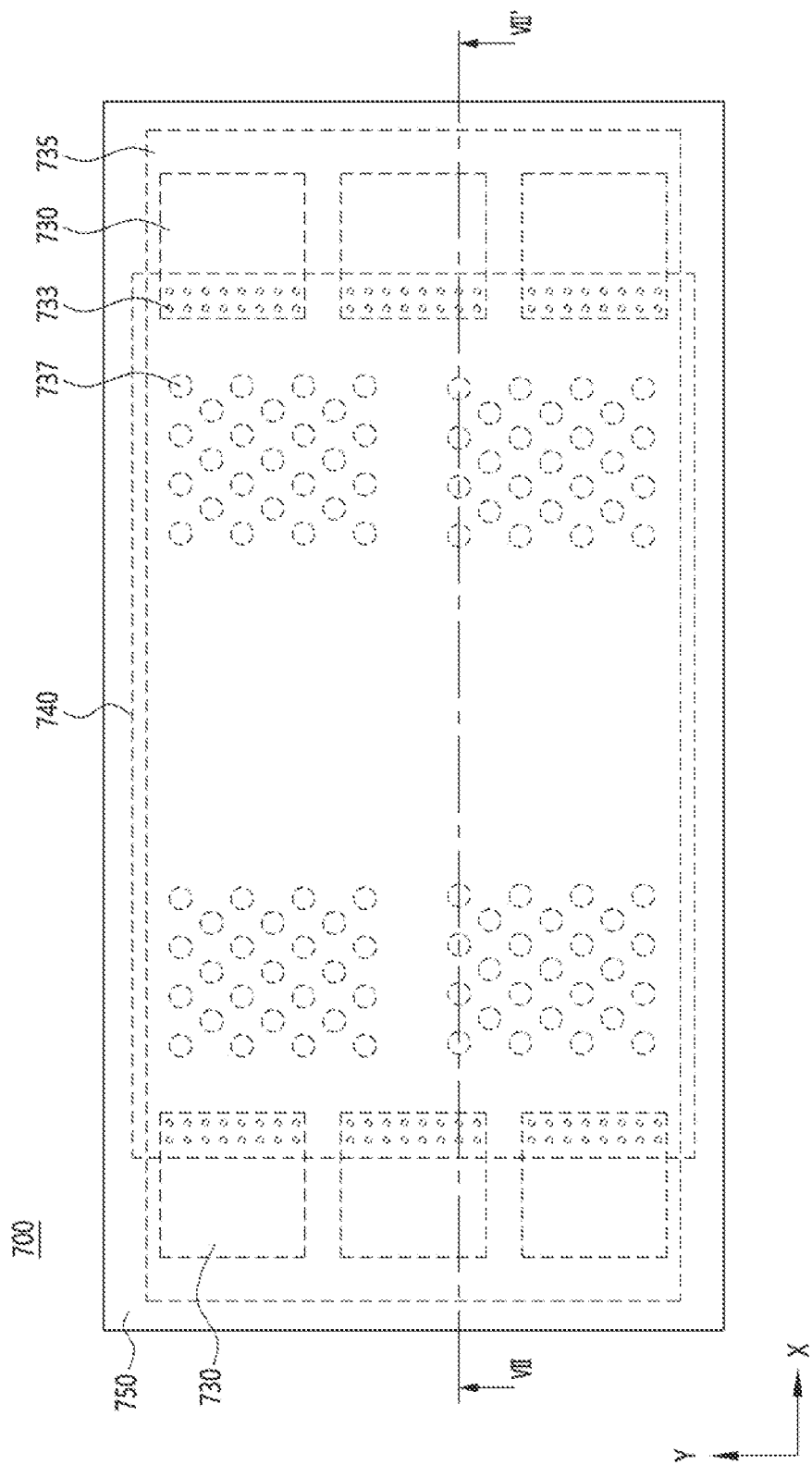
FIG. 17 is a plan view illustrating a semiconductor package in accordance with various embodiments.
Figure 18:
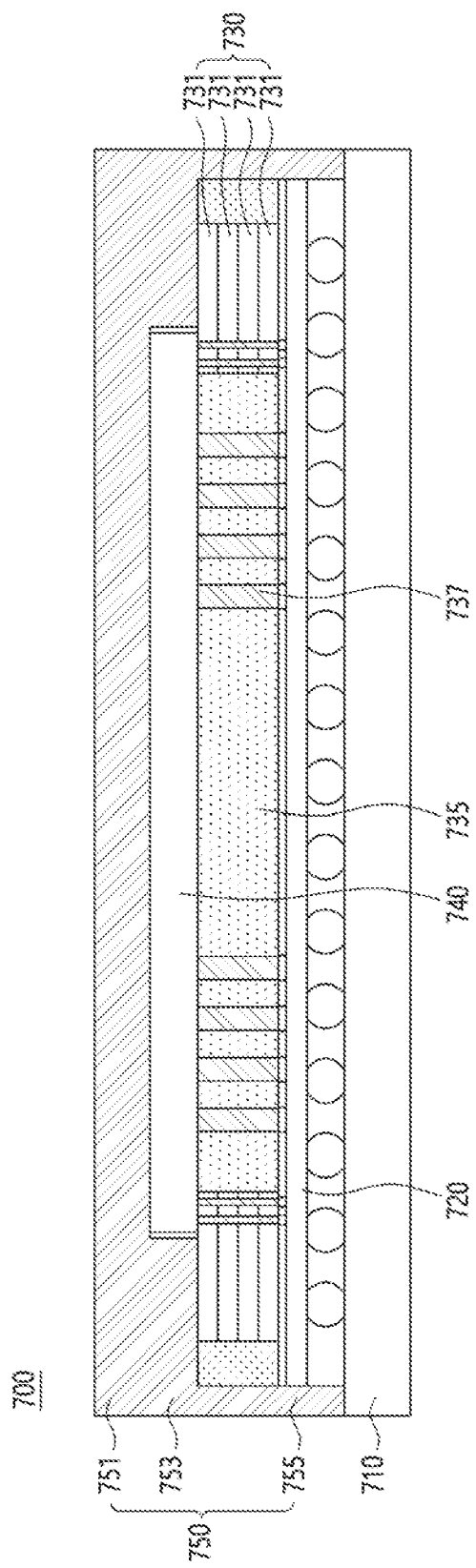
FIG. 18 is a cross-sectional view taken along a line VII-VII' in FIG. 17 in accordance with various embodiments.

FIG. 17 is a plan view illustrating a semiconductor package in accordance with various embodiments, and FIG. 18 is a cross-sectional view taken along a line VII-VII' in FIG. 17 in accordance with various embodiments.

A semiconductor package 700 of this example of an embodiment may include elements substantially the same as those of the semiconductor package 100A in FIG. 2. Thus, any further illustrations with respect to the same elements may be omitted herein for brevity.

Referring to FIGS. 17 and 18, the semiconductor package 700 may include a package substrate 710, a redistribution layer (RDL) 720, a plurality of memory stack 730, a molding layer 735, a processor chip 740 and a heat dissipation structure 750.

The heat dissipation structure 750 may be disposed on the package substrate 710 to cover the RDL 720, the memory stacks 730, the molding layer 735 and the processor chip 740. For example, the heat dissipation structure 750 may include a first portion 751, a second portion 753 and a third portion 755. The first portion 751 of the heat dissipation structure 750 may have a plate shape substantially parallel to an upper surface of the package substrate 710. The second portion 753 of the heat dissipation structure 750 may have a hollow portion corresponding to the processor chip 740. The third portion 755 of the heat dissipation structure 750 may have a hollow portion corresponding to the RDL 720. The heat dissipation structure 750 may include an outer surface and an inner surface opposite to the outer surface. The inner surface of the heat dissipation structure 750 may have a step-like shape. Further, the first portion 751, the second portion 753 and the third portion 755 of the heat dissipation structure 750 may be integrally formed with each other.

A lower surface of the first portion 751 of the heat dissipation structure 750 may be contact with an upper surface of the processor chip 740. A lower surface of the second portion 753 of the heat dissipation structure 750 may be contact with upper surfaces of the memory stacks 730. An inner surface of the third portion 755 of the heat dissipation structure 750 may be contact with outer surfaces of the RDL 720 and the molding layer 735. The heat dissipation structure 750 may include a metal such as copper, nickel, etc., not limited thereto.

Although not depicted in FIG. 18, a heat sink may be disposed on the upper surface of the first portion 751 of the heat dissipation structure 750.

Figure 19:
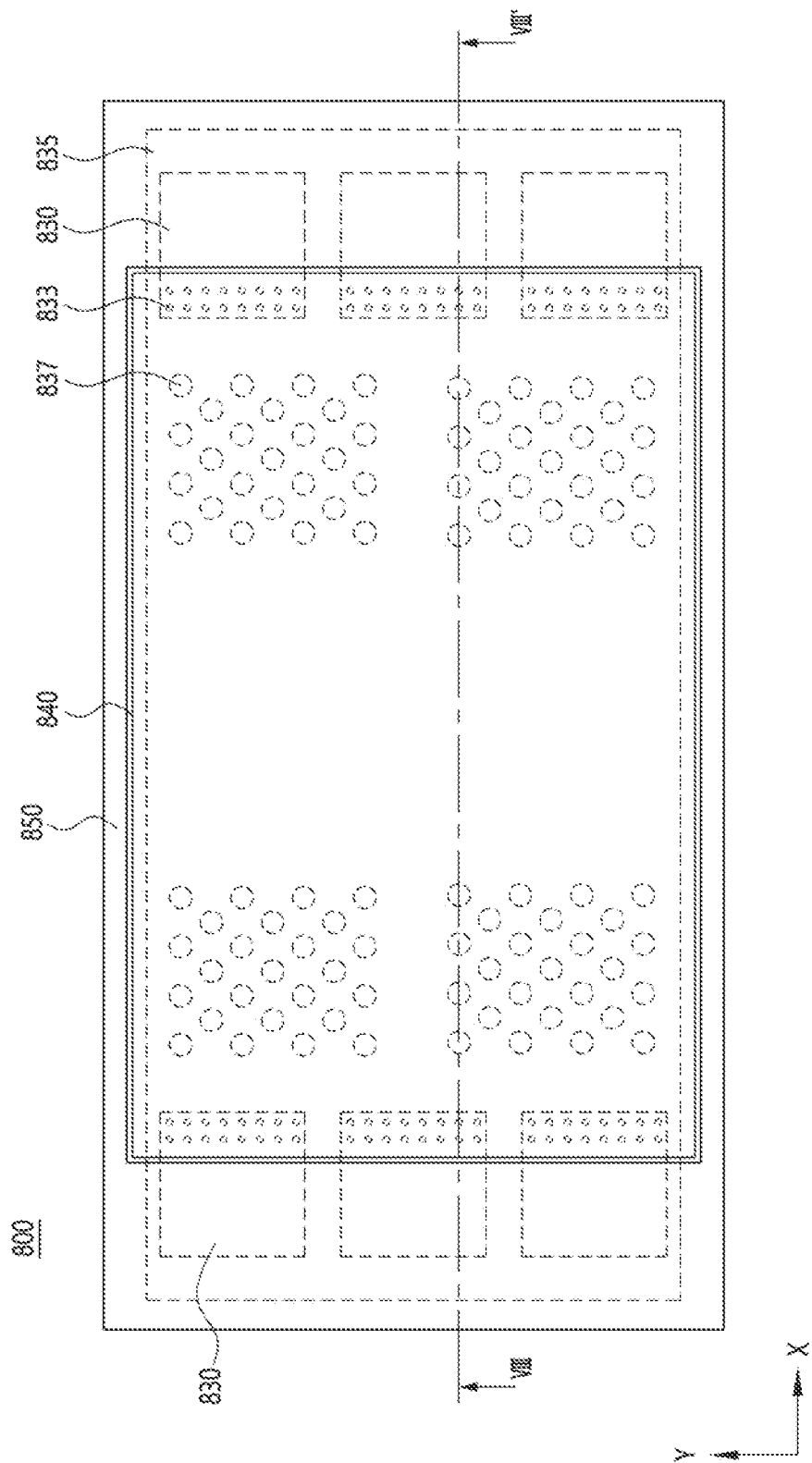
FIG. 19 is a plan view illustrating a semiconductor package in accordance with various embodiments.

FIG. 19 is a plan view illustrating a semiconductor package in accordance with various embodiments, and FIG. 20 is a cross-sectional view taken along a line VIII-VIII' in FIG. 19 in accordance with various embodiments.

A semiconductor package 800 of this example of an embodiment may include elements substantially the same as those of the semiconductor package 100A in FIG. 2. Thus, any further illustrations with respect to the same elements may be omitted herein for brevity.

Referring to FIGS. 19 and 20, the semiconductor package 800 may include a package substrate 810, a redistribution layer (RDL) 820, a plurality of memory stack 830, a molding layer 835, a processor chip 840 and a heat dissipation structure 850.

The heat dissipation structure 850 may be disposed on the package substrate 810 to cover the RDL 820, the memory stacks 830 and the molding layer 835. For example, the heat dissipation structure 850 may include a first portion 851 and a second portion 853. The first portion 851 of the heat dissipation structure 850 may have a hollow portion corresponding to the processor chip 840. The second portion 853 of the heat dissipation structure 850 may have a hollow portion corresponding to the RDL 820. The first portion 851 and the second portion 853 of the heat dissipation structure 850 may be integrally formed with each other.

The first portion 851 of the heat dissipation structure 850 may be contact with side surfaces of the processor chip 840 and upper surfaces of the memory stacks 830. An inner surface of the second portion 853 of the heat dissipation structure 850 may be in contact with outer surfaces of the RDL 820 and the molding layer 835. The heat dissipation structure 850 may include a metal such as copper, nickel, etc., not limited thereto.

Although not depicted in FIG. 20, a heat sink may be disposed on the upper surfaces of the first portion 851 of the heat dissipation structure 850 and the upper surface of the processor chip 840.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Another additions, subtractions, or modifications are obvious in view of the present disclosure and are intended to fall within the scope of the appended claims.

What is claimed is:

1. A semiconductor package comprising:
   a package substrate;
   a plurality of memory stacks disposed and spaced apart from each other on the package substrate by a predetermined distance;
   at least one processor chip disposed on the plurality of memory stacks and partially overlapped with each of the plurality of memory stacks; and
   one or more heat dissipation structures disposed on upper surfaces of the plurality of memory stacks,
   wherein each of the plurality of memory stacks comprises an overlapped portion overlapped with the at least one processor chip viewed in a plan view and a non-overlapped portion not being overlapped with the at least one processor chip viewed in the plan view.

2. The semiconductor package of claim 1,
   wherein the plurality of memory stacks and the at least one processor chip are electrically connected with each other by a hybrid bonding process or a bump bonding process.

3. The semiconductor package of claim 1,
   wherein each of the plurality of memory stacks included in the plurality of memory stacks comprises:
   a plurality of memory chips vertically stacked on the package substrate; and
   a through silicon via (TSV) formed through each of the memory chips to electrically connect the memory chips with the at least one processor chip.

4. The semiconductor package of claim 3,
   wherein the TSV is positioned at an edge portion of each of the plurality of memory stacks.

5. The semiconductor package of claim 3,
   wherein the TSV is positioned at a central portion of each of the plurality of memory stacks.

6. The semiconductor package of claim 1, further comprising a molding layer formed to expose the upper surfaces and lower surfaces of the plurality of memory stacks and to surround side surfaces of the plurality of memory stacks.

7. The semiconductor package of claim 6, further comprising a through molding via (TMV) formed through the molding layer to electrically connect the at least one processor chip with the package substrate.

8. The semiconductor package of claim 1, further comprising a semiconductor chip disposed on a lower surface of the at least one processor chip.

9. The semiconductor package of claim 1, further comprising a plurality of bridge dies disposed on the package substrate adjacent to the plurality of memory stacks.

10. The semiconductor package of claim 9, further comprising through silicon vias (TSVs) formed through the bridge dies to electrically connect the at least one processor chip with the package substrate.

11. The semiconductor package of claim 9,
wherein each of the plurality of memory stacks are molded with a corresponding bridge die among the bridge dies.

12. The semiconductor package of claim 1,
wherein each of the plurality of memory stacks comprises;
a first region overlapped with the at least one processor chip in a vertical direction;
a second region overlapped with a part of the at least one processor chip and a part of the one or more heat dissipation structures in the vertical direction; and
a third region overlapped with the one or more heat dissipation structures in the vertical direction.

13. The semiconductor package of claim 12,
wherein the first region of each of the plurality of memory stacks comprises a peripheral circuit region, the second region of each of the plurality of memory stacks comprises dummy cells and the third region of each of the plurality of memory stacks comprises working cells.

14. The semiconductor package of claim 1,
wherein each of the plurality of memory stacks comprises:
a plurality of memory chips vertically stacked on the package substrate;
a controller chip disposed on an uppermost memory chip among the memory chips; and
one or more through silicon vias (TSV) formed through each of the memory chips and the controller chip to electrically connect the memory chips with the at least one processor chip.

15. The semiconductor package of claim 1, further comprising a lower redistribution layer (RDL) disposed between the package substrate and the plurality of memory stacks.

16. The semiconductor package of claim 15, further comprising an upper RDL disposed between the plurality of memory stacks and the at least one processor chip.

17. The semiconductor package of claim 1, further comprising a lid disposed on the package substrate to cover the plurality of memory stacks, the processor chip and the one or more heat dissipation structures.

18. The semiconductor package of claim 1,
wherein the one or more heat dissipation structures are configured to cover side surfaces and an upper surface of the processor chip and side surfaces of the plurality of memory stacks.

19. The semiconductor package of claim 1,
wherein the one or more heat dissipation structures are configured to cover side surfaces of the at least one processor chip and side surfaces of the plurality of memory stacks.

20. The semiconductor package of claim 1,
wherein the at least one processor chip comprises a plurality of the processor chips, and the plurality of the processor chips are stacked on the package substrate in a vertical direction.

21. A semiconductor package comprising:
a package substrate;
a first memory stack spaced apart from a second memory stack by a predetermined distance, the first and second memory stacks disposed on the package substrate; and
at least one processor chip disposed on the first and second memory stacks and partially overlapped with each of the first and second memory stacks to expose upper surfaces of the first and second memory stacks,
wherein each of the first and second memory stacks comprises an overlapped portion overlapped with the at least one processor chip viewed in a plan view and a non-overlapped portion not being overlapped with the at least one processor chip viewed in the plan view.

* * * * *